(12) United States Patent
Wang

(10) Patent No.: US 11,804,467 B2
(45) Date of Patent: Oct. 31, 2023

(54) RADIATIVE HEAT COLLECTIVE BONDER AND GANGBONDER

(71) Applicant: Micron Technology, Inc., Boise, ID (US)

(72) Inventor: Chao Wen Wang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 16/912,547

(22) Filed: Jun. 25, 2020

(65) Prior Publication Data
US 2021/0407958 A1 Dec. 30, 2021

(51) Int. Cl.
*B23K 1/005* (2006.01)
*H01L 23/00* (2006.01)
*B23K 1/00* (2006.01)
*B23K 101/40* (2006.01)

(52) U.S. Cl.
CPC .............. *H01L 24/75* (2013.01); *B23K 1/005* (2013.01); *B23K 1/0016* (2013.01); *H01L 24/17* (2013.01); *H01L 24/81* (2013.01); *B23K 2101/40* (2018.08); *H01L 2224/17181* (2013.01); *H01L 2224/75272* (2013.01); *H01L 2224/75301* (2013.01); *H01L 2224/8121* (2013.01); *H01L 2224/81203* (2013.01)

(58) Field of Classification Search
None
See application file for complete search history.

(56) References Cited

U.S. PATENT DOCUMENTS

| | | | | |
|---|---|---|---|---|
| 5,993,591 A * | 11/1999 | Buendia | .................. | B29C 35/08 |
| | | | | 156/359 |
| 6,234,374 B1 * | 5/2001 | Hwang | ............. | H01L 21/67115 |
| | | | | 228/180.5 |
| 6,384,366 B1 * | 5/2002 | Wong | ...................... | H01L 24/81 |
| | | | | 228/232 |
| 6,437,450 B1 * | 8/2002 | Baba | .................. | H01L 21/67092 |
| | | | | 257/E21.503 |
| 7,015,572 B2 * | 3/2006 | Yamaji | ..................... | H01L 25/50 |
| | | | | 257/E21.705 |
| 7,288,472 B2 * | 10/2007 | Frutschy | ................. | H01L 24/80 |
| | | | | 257/E21.511 |
| 7,344,755 B2 * | 3/2008 | Beaman | ............ | C23C 16/45546 |
| | | | | 427/255.394 |
| 9,340,507 B2 * | 5/2016 | Oost | ..................... | C07D 513/04 |
| 10,978,420 B2 * | 4/2021 | Hagiwara | ............... | H01L 21/52 |

(Continued)

*Primary Examiner* — Devang R Patel
(74) *Attorney, Agent, or Firm* — Perkins Coie LLP

(57) ABSTRACT

A radiative heat collective bonder or gangbonder for packaging a semiconductor die stack is provided. The bonder generally includes a shroud positioned at least partially around the die stack and a radiative heat source positioned inward of the shroud and configured to emit a radiative heat flux in a direction away from the shroud. The bonder may further include a bondhead configured to contact the backside of the topmost die in the die stack and optionally include another bondhead configured to contact a substrate beneath the die stack. The radiative heat source may be configured to direct the radiative heat flux to at least a portion of the die stack to reduce a vertical temperature gradient in the die stack. One or both of the bondheads may be configured to concurrently direct a conductive heat flux into the die stack.

20 Claims, 2 Drawing Sheets

(56) References Cited

U.S. PATENT DOCUMENTS

2005/0061856 A1* 3/2005 Maki ................. H01L 24/29
          228/234.1
2017/0243851 A1* 8/2017 Rangelov ............ B23K 1/0016

* cited by examiner

RADIATIVE HEAT COLLECTIVE BONDER AND GANGBONDER

TECHNICAL FIELD

The present disclosure is generally directed to bonded semiconductor devices, and in several embodiments, more particularly to systems and methods for thermocompression collective bonding and gangbonding of semiconductor dies.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these demands, semiconductor die manufacturers often stack multiple semiconductor dies vertically on top of each other to increase the capacity or performance of a microelectronic device within the limited volume on the circuit board or other element to which the semiconductor dies are mounted. The stacks may be bonded together using a bonding material. For such vertically stacked semiconductor dies, through-silicon vias (TSV) are often used. These TSVs on adjacent semiconductor dies are typically electrically connected to each other using direct physical coupling in which the bond pads of one die are directly bonded to the bond pads of the other.

DETAILED DESCRIPTION

Figure 1:
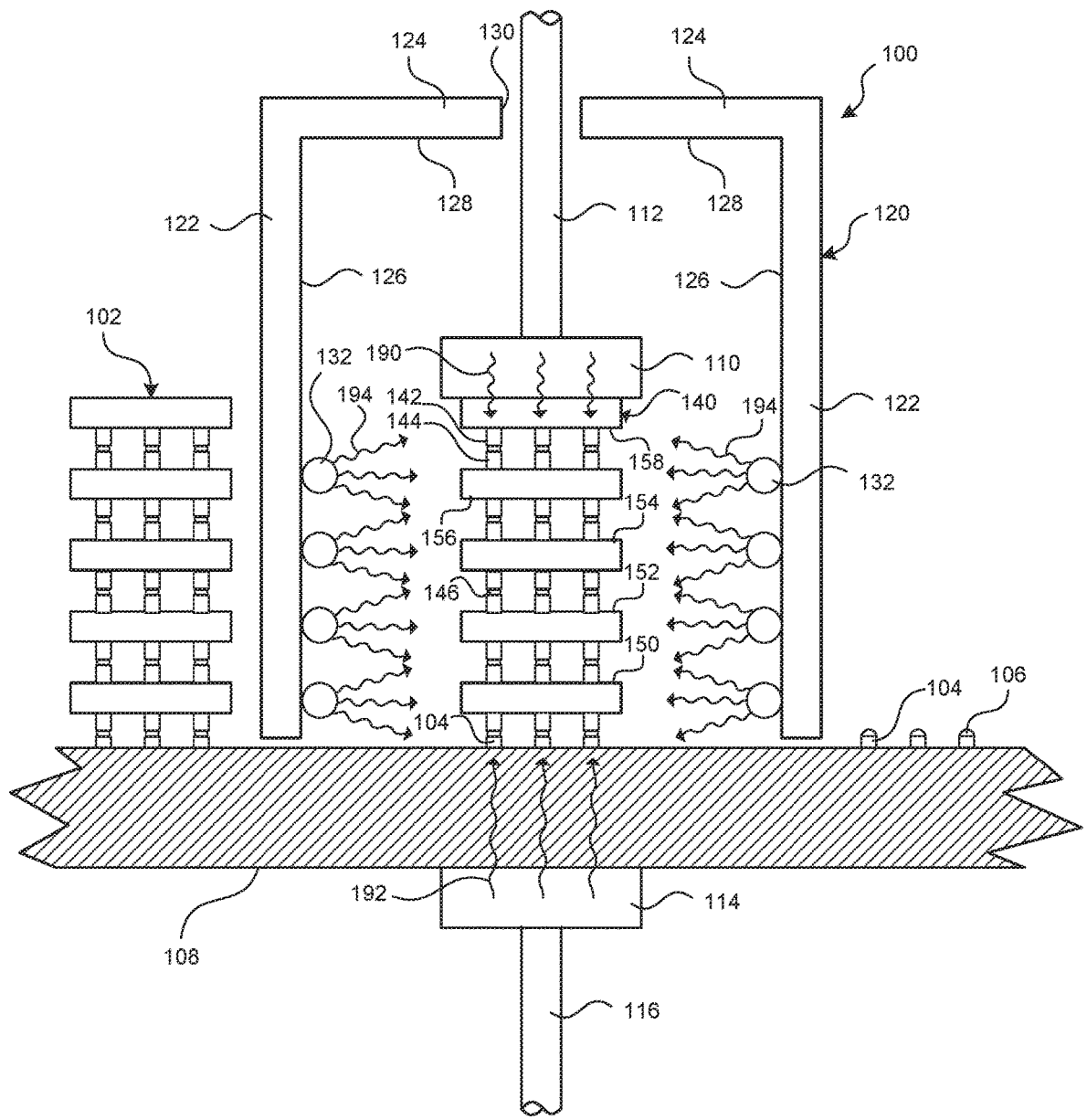
FIG. 1 is an enlarged cross-sectional view showing a semiconductor device and a thermocompression gangbonder configured in accordance with an embodiment of the present technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate or to a singulated, die-level substrate, or another die for die-stacking applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The term "bondhead" can refer to an upper and/or lower chuck, tip, or tool for use in mounting semiconductor dies to substrates. Such bondheads may be capable of applying heat and/or pressure to the semiconductor die or stack of dies. A person skilled in the relevant art will understand that the technology may have additional embodiments and that the technology may be practiced without several of the details of the embodiments described below with reference to FIGS. 1 and 2, and that suitable steps of methods described herein can be performed at the wafer-level or at the die-level.

The term "shroud" can refer to a heat insulating and/or reflecting shroud configured to at least partially surround one or more semiconductor die stacks during gangbonding. The description and illustration of the shapes and configurations of a gangbonder heat shroud herein are exemplary, and should not be construed as limiting the scope of the present disclosure. In this regard, in several embodiments, the shape of the gangbonder heat shroud is any shape or configuration suitable to sufficiently restrict heat transfer to components outside of the gangbonder shroud and/or reflect heat energy from a heat source to desired areas within the gangbonder shroud.

In several embodiments, a semiconductor die includes at least one contact (e.g., bond pads or portions of TSVs that extend through the die) exposed on a front or back side of the die. In these embodiments, an interconnect structure is electrically coupled by bonding to the contact to allow an electrical connection to be formed with other components of the semiconductor device with solder or other conductive material.

Thermocompression bonding (TCB) can be used to bond semiconductor dies to a substrate or another semiconductor device, either individually, or in groups, e.g., by sequential bonding, collective bonding, gangbonding, etc. Sequential bonding generally involves bonding a single semiconductor die per cycle and includes holding a representative semiconductor die against a bondhead with a tuned temperature and pressure profile to apply heat and pressure to the backside of the die, such that the heat from the bondhead transfers through the die to sufficiently heat solder to form electrical connections between the interconnect structures on the back side of the die and the bonding surface of the substrate, die, device, etc. Sequential bonding includes repeating this process for each die in the die stack until the stack is formed (e.g., "2H" for a 2-die-high stack, "4H" for a 4-die-high stack, 8H for an 8-die-high stack, etc.).

Collective bonding generally includes bonding a stack of semiconductor dies to a substrate, by first "quick tacking" the dies in a stacked position and then applying heat and pressure to the die stack. During quick tacking, the temperature and pressure applied to each die is lower and only sufficient to flow the non-conductive film (NCF) that is laminated on the pillar side of the die. The quick tack of the dies does not complete the electrical connections, and a final collective bond step is performed where heat and force is applied to the entire stack by a bondhead from the top and/or the bottom of the stack to flow the solder and collectively bond the dies. In an example of an 8H stack, all 8 dies can be quick tacked and then collectively bonded, or 7 of the dies can be quick tacked and then collectively bonded through an eighth die (i.e., top die). Quick tacking and the step of collective bonding can both be performed using the same tool, or by any number of tools. Although collective bonding may increase efficiency when compared to sequential bonding, each of these processes are relatively inefficient compared to gangbonding.

The process of thermocompression gangbonding can be used to simultaneously bond multiple die stacks and increase efficiency over sequential and collective bonding. In the gangbonding process, multiple die stacks are quick tacked in place. Inside the gangbonder, a shank with a bondhead above the stack contacts the backside of the top die and, in some embodiments, a second shank with a bondhead is positioned below the die stack under the substrate or device. The bondheads can apply heat to the top and or bottom of the die stack using conductive heating, such as heat conduction through the shank to the bondhead, or with a piezoelectric heater in the bondhead, among other suitable heat sources. In this regard, the upper and lower bondheads apply heat directed toward each other from the top and bottom dies of the stack to heat each of the interconnects within the die stack. The interconnects must be heated until the solder at each connection reaches a solidus point at which it flows to form the electrical and mechanical connections between the dies in the stack. During the gangbonding process, the bondheads may also apply opposing compressive pressure to create the desired bond line thickness (BLT) between dies. The bondheads may be formed from a suitable material to withstand the temperatures, pressures, and cycles of the gangbonding process, e.g., ceramic material with a heat-resistant polymer cover, among other materials. In other embodiments, the gangbonding process is performed without a lower bondhead, and instead the substrate or wafer to which the die is being bonded is sitting on a stage or other platform with or without heat.

TCB processes are performed at high temperatures to ensure the bonding material reaches a desired internal temperature to reliably form the interconnects, and as more dies are assembled in high density die stacks for gangbonding (e.g., 4, 6, 8 or more dies in a stack) still higher temperatures are needed to create the interconnect bonds due to temperature gradients. During gangbonding of a die stack using conventional gangbonding techniques, a large temperature gradient can occur because of the rate of conductive heat transfer from the upper and lower bondheads through the substrate and die stack, and as a result of the low thermal conductivity of the NCF. Accordingly, the temperature of the dies nearest the bondheads can be higher than the dies near the center of the die stack before the stack reaches a vertical temperature equilibrium. Conventional gangbonding processes typically do not last long enough for such equilibrium to occur, as the solder near the top and bottom dies generally reaches solidus quicker than the rise in temperature at the vertical center of the die stack. As such, the temperature required at the bondheads to melt and flow the bonding material at the vertical center of the stack may be significantly higher than the solidus point, which can result in inconsistent BLT through the die stack, oxidized unprocessed sites, and/or damage to other nearby components. The potential damage caused by elevated temperatures limits the quantity of dies that can be gangbonded in a die stack using conventional processes. Embodiments of the present technology reduce the potential damage by applying heat to the die stack in a manner that decreases the temperature gradient across the height of the die stack such that lower temperatures can be applied to the top and bottom of the die stack to create interconnect bonds. The shrouds disclosed herein may also be configured to shield surrounding components during the thermocompression gangbonding process.

In embodiments of the present technology, a radiative heat source is applied in addition to or in place of the conductive heating in the bondheads during thermocompression gangbonding. The radiative heat source may be configured to apply a radiative heat flux (e.g., by heat lamps emitting electromagnetic radiation, such as light emitting diode (LED) or filament lamps emitting infrared (IR), ultraviolet (UV), etc.) to areas of the die stack (e.g., from the sides) to flow the solder and form the electrical connections, and/or to reduce the vertical temperature gradient caused by the conductive heating from the bondheads. The conductive heat from the bondheads can optionally be omitted such that the radiative heat is the sole heat source during gangbonding, or the radiative heat can be used in conjunction with heat from the bondheads.

The radiative heat source can be applied in conjunction with a shroud configured to at least partially surround one or more semiconductor die stacks during gangbonding. The shroud can be configured to insulate components outside of the shroud from the heat created by the bondheads and/or the radiative heat lamps. The shroud may also have inner surfaces configured to reflect the radiation from the heat lamps, creating more uniform heating of the stack, and/or distribute the heat to areas of the die stack that are not aligned with the direct radiative heating, as will be explained in greater detail below.

Among other advantages over conventional technology, the radiative heat source processes described herein can provide improved throughput; improved die stack reliability through reduction of solder non-wets, cold joints, open interconnects, defects, or higher resistance interconnects; extended equipment and bondhead life; lower cost of operation; and higher process capability for gangbonding. Further, applying radiative heat to the die stack can be more reliably controlled when compared to conductive heating, and the reflective shroud can improve the uniformity of the heat applied to the die stack. The configurations of the present technology may be described herein in reference to TSV and/or three-dimensional integration ($3D^1$); however, the present technology also applies to other interconnect types, including flip chip bonding (FC), direct chip attachment (DCA), and D2S, among others. The description of the present technology in conjunction with a specific configuration should not be construed as limiting the applications of the present technology.

FIG. 1 is an enlarged cross-sectional view showing a semiconductor device and a thermocompression gangbonder assembly 100 configured in accordance with an embodiment of the present technology. The gangbonder assembly 100 is shown positioned in contact with a die stack of the semiconductor device and to form the electrical connections between the contacts on each die and the semiconductor device. The semiconductor device of FIG. 1 includes an example of a previously processed die stack 102 mechanically and electrically coupled to a substrate 108. The die stack 102 is shown after a gangbonding process of the present technology has been performed, which forms the electrical connections and sets the BLT between each die in the die stack 102. The semiconductor device of FIG. 1 also includes an unprocessed site having traces 104 and solder portions 106 configured to receive a die stack in a subsequent gangbonding process. The configuration of the semiconductor device in the Figures is but a single example and is not intended to limit the semiconductor device to the illustrated configuration. In other embodiments, the semiconductor device has any suitable configuration of components.

The gangbonder assembly 100 may include a first, upper bondhead 110 fixed to an upper shank 112, and a second, lower bondhead 114 fixed to a lower shank 116. The upper bondhead 110 and upper shank 112 may be configured to apply heat and/or pressure through the upper bondhead 110 to an uppermost semiconductor die to facilitate gangbonding of a die stack 140. An exemplary die stack 140 for gangbonding may include a first die 150, a second die 152, a third die 154, a fourth die 156, and a fifth die 158; however, the gangbonding process described herein is suitable for use with any number of dies in a stack. The first die 150 can be a lowermost die, the fifth die 158 can be an uppermost die, and the dies 152, 154, and 156 can be intermediate dies. As shown, the die stack 140 is stacked on top of traces 104 of the substrate 108 such that the lowermost die 150 contacts the traces 104. Each of the first, second, third, and fourth dies 150, 152, 154, and 156 in the die stack 140 have both lower conductive interconnects 142 extending from a front side of the die, and upper interconnects 144 (e.g., TSVs, pillars on bond pads, etc.) extending from a backside of the die. The fifth die 158 has only lower conductive interconnects 142 extending from the backside of the die 158. Each of the conductive interconnects 142 and 144 form electrical connections between the substrate 108 and the dies 150-158. The interconnects 142 and 144 may be electrically coupled with solder 146, which melts and flows during the gangbonding process.

The upper bondhead 110 may transfer a conductive heat flux 190 into the uppermost die 158 of the die stack 140 such that the heat flux 190 travels through the components of the die stack 140 toward the lower bondhead 114. The lower bondhead 114 and lower shank 116 may be configured to apply heat and/or pressure through the lower bondhead 114 into the substrate 108 to transfer a conductive heat flux 192 into the substrate 108 such that the heat flux 192 travels through the substrate 108, into the traces 104, and through the components of the die stack 140 toward the upper bondhead 110. The heat fluxes 190 and 192 have rates of heat transfer determined by the temperatures of the bondheads 110 and 114, and the thermal conductivity of the materials used in the substrate 108 and the die stack 140. As such, during gangbonding of the die stack 140, some vertical temperature gradients may exist within the die stack 140, generally governed by Fourier's Law, causing an intermediate point in the intermediate dies 152, 154, and 156 to have the slowest rate of temperature increase within the die stack 140.

The gangbonder assembly 100 may include a shroud or shroud assembly 120 configured to at least partially enclose a stack of dies to be processed by the gangbonder assembly 100. The shroud assembly 120 includes sidewalls 122, an upper wall 124, and an opening 130 through which the upper shank 112 passes. The lower end of the shroud assembly 120 may be open and configured to allow the shroud assembly 120 to be placed over the die stack 140 for the gangbonding process. The sidewalls 122 and upper wall 124 may be configured to insulate the heat generated within the shroud assembly 120, which can provide more predictable temperatures to improve control within the shroud assembly 120 and protect neighboring components, such as the die stack 102 and the traces 104 of the unprocessed site. As noted above, the sidewalls 122 may include radiatively reflective sidewall surfaces 126 facing the upper bondhead 110 and/or die stack 140, and the upper wall 124 may include a radiatively reflective upper wall surface 128 facing the upper bondhead 110 and/or die stack 140, each having a radiation reflection coefficient. The reflective surfaces 126 and 128 are configured to reflect the radiative heat generated within the shroud assembly 120 toward the die stack 140 to reduce the vertical temperature gradient in the intermediate dies 152, 154, and 156. In some embodiments, one or more fins, dividers, and/or compartments (not shown) may be positioned within the shroud assembly 120 to shield areas where elevated temperatures are not desired, or to direct the heat to areas for more uniform heating of the die stack 140.

One or more radiative heating elements 132 may be positioned within the shroud assembly 120 to provide additional heating of the die stack 140 during the gangbonding process. The radiative heating elements 132 selectively transfer a radiative heat flux 194 into the die stack 140. In the illustrated embodiment in FIG. 1, the radiative heating elements 132 are generally positioned lateral to the dies of the die stack 140 near the sidewalls 122 and are configured to direct the radiative heat flux 194 to the sides of the die stack 140. The radiative heating elements 132, for example, can be configured to direct the radiative heat flux 194 to areas of the die stack 140 where the vertical temperature gradient would be the greatest, i.e., along the intermediate dies 152, 154, and 156 between the upper and lower bondheads 110 and 114. The radiative heat flux 194 can reduce the vertical temperature gradient in the die stack 140 by more uniformly heating the intermediate area of the die stack 140 furthest away from the upper and lower bondheads 110 and 114. In this regard, the radiative heating elements 132 may directly transfer radiative heat flux 194 into the components of the die stack 140, or may have portions of the radiative heat flux 194 reflected off the reflective sidewall surfaces 126 and the reflective upper wall surface 128 and into the components of the die stack 140. In other embodiments, the shroud assembly 120 itself may be heated to apply a conductive heat flux to the die stack 140. In some embodiments, the heat fluxes 190 and 192 are omitted from the upper and lower bondheads 110 and 114, such that only the radiative heat flux 194 is applied to the die stack 140.

Figure 2:
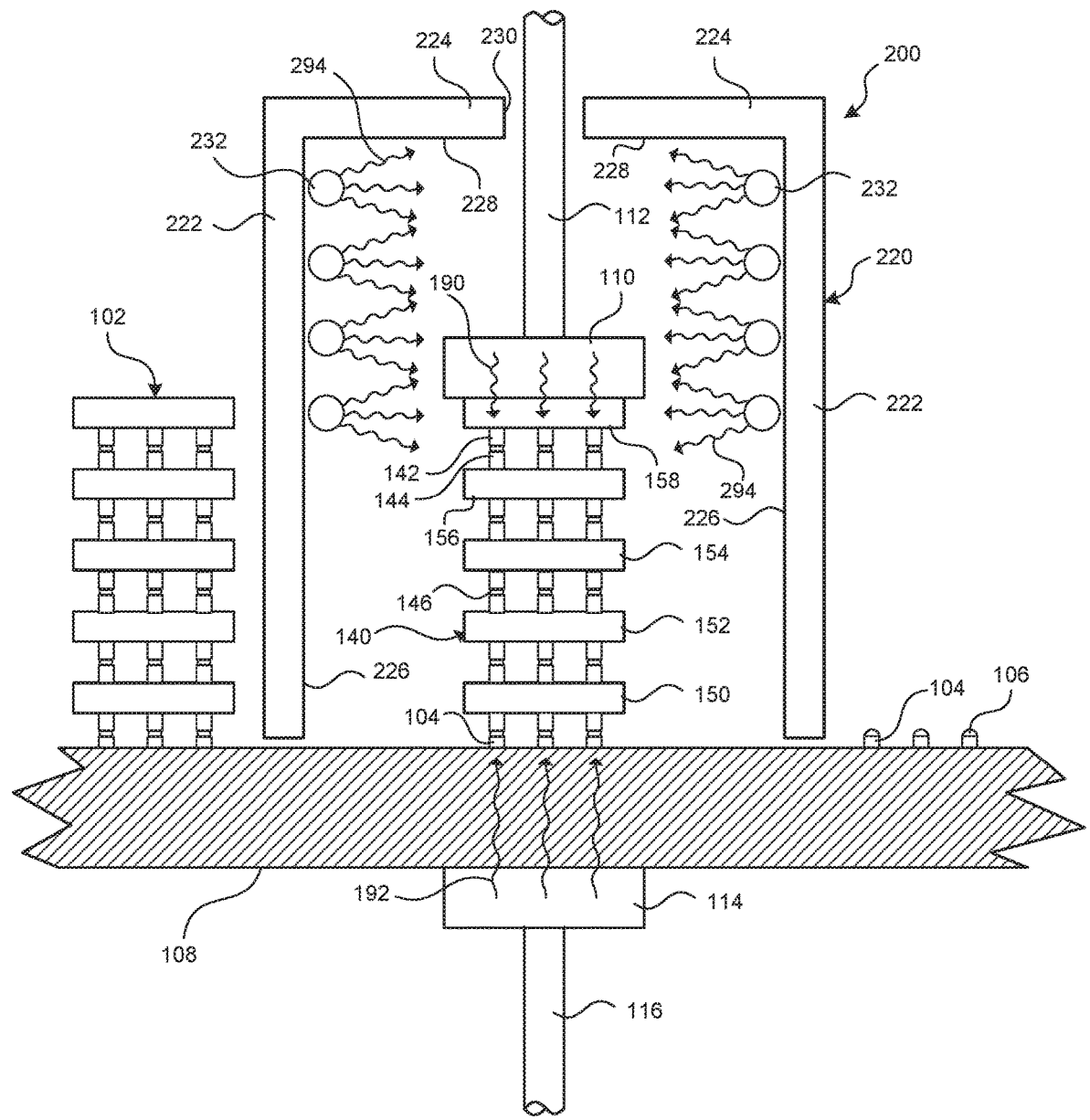
FIG. 2 is an enlarged cross-sectional view showing a semiconductor device and a thermocompression gangbonder configured in accordance with another embodiment of the present technology.

FIG. 2 is an enlarged cross-sectional view showing a semiconductor device and a thermocompression gangbonder assembly 200 configured in accordance with another embodiment of the present technology. The gangbonder assembly 200 is similar to the gangbonder assembly 100, except that the position of the radiative heat source differs. The gangbonder assembly 200 includes a shroud assembly 220 configured to at least partially enclose a stack of dies to be processed by the gangbonder assembly 200. The shroud assembly 220 includes sidewalls 222, an upper wall 224, and a shank opening 230 through which the upper shank 112 passes. The lower end of the shroud assembly 220 may be open and configured to allow the shroud assembly 220 to be placed over the die stack 140 for the gangbonding process. The sidewalls 222 may include reflective sidewall surfaces 226, and the upper wall 224 may include a reflective upper wall surface 228, each having a reflection coefficient. The reflective surfaces 226 and 228 are configured to reflect the radiative heat generated within the shroud assembly 220.

The gangbonder assembly 200 includes one or more radiative heating elements 232 position within the shroud assembly 220 to provide additional heating of the die stack 140 during the gangbonding process. In the illustrated embodiment in FIG. 2, the radiative heating elements 232 are generally positioned above the die stack 140 and lateral to the upper bondhead 110 and the upper shank 112. The radiative heating elements 232 emit a radiative heat flux 294 within the shroud assembly 220 to provide additional heat into the die stack 140 to reduce the vertical temperature gradient. Since the radiative heating elements 232 of the gangbonder assembly 200 are generally not positioned lateral to the die stack 140, the radiative heat flux 294 can be reflected off the reflective sidewall surfaces 226 and the reflective upper wall surface 228 to direct the radiative heat flux 294 toward the die stack 140. In some configurations, the die stack 140 has a relatively short height in comparison to some radiative heat sources, such that only a single radiative heat source or only some of the radiative heat sources can be positioned lateral to the die stack based on physical size.

In a plan view of the illustrated embodiments, the shroud assemblies 120 and 220 may have a square, rectangular, geometric, or arcuate shape, among other suitable shapes. In further embodiments, the shroud assemblies 120 and 220 may be sized and configured to surround multiple die stacks for simultaneous gangbonding. In these embodiments, additional upper and lower bondheads and shanks are suitably added to the gangbonder assembly to gangbond more than one die stack within a shroud. In some embodiments, the shroud assemblies are fixed to the upper shanks of the gangbonder, such that the shroud assemblies move with the shanks. In other embodiments, the shroud assemblies are movable with respect to the upper bondhead and shank and moved separately during the gangbonding process, such that the shroud assembly can accommodate gangbonding of die stacks with multiple heights.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. For example, while the specification focuses on thermocompression bonding with NCF, NCP, and/or WLUF, the present technology can also be applied to other processes and/or applications, such as fluxes used for microbump formation and flip-chips. In some cases, well known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The present disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

I claim:

1. A semiconductor die stack bonding tool, comprising:
   a bondhead coupled to a shank and configured to contact a backside of a topmost die in a die stack formed on a substrate;
   a shroud positioned adjacent to the bondhead, the shroud having a sidewall with a first radiatively reflective inner surface facing the bondhead and an upper wall; and
   a radiative heat source positioned above the bondhead and at a first portion of the first radiatively reflective inner surface to selectively emit a radiative heat flux in a direction away from the first portion of the first radiatively reflective inner surface toward a second portion of the first radiatively reflective inner surface such that the radiative heat flux reflects off of the second portion of the first radiatively reflective inner surface to at least a portion of the die stack to reduce a vertical temperature gradient in the die stack.

2. The semiconductor die stack bonding tool of claim 1, wherein the bondhead applies a conductive heat flux to the topmost die in the die stack.

3. The semiconductor die stack bonding tool of claim 1, wherein the bondhead comprises a first bondhead and the shank comprises a first shank, and wherein the semiconductor die stack bonding tool further comprises a second bondhead coupled to a second shank and configured to contact the substrate, the second bondhead aligned vertically with the first bondhead and positioned on a side of the substrate opposite the die stack.

4. The semiconductor die stack bonding tool of claim 3, wherein the first bondhead applies a first conductive heat flux to the topmost die in the die stack, and wherein the second bondhead applies a second conductive heat flux to the substrate toward a bottom of the die stack.

5. The semiconductor die stack bonding tool of claim 1, wherein the upper wall has an opening through which the shank passes.

6. The semiconductor die stack bonding tool of claim 1, wherein the upper wall has a second radiatively reflective inner surface positioned above and facing the bondhead and the radiative heat flux flows to the portion of the die stack by reflecting off of the second radiatively reflective inner surface.

7. The semiconductor die stack bonding tool of claim 1, wherein an additional radiative heat source is positioned directly lateral to the die stack during collective bonding or gangbonding such that an additional radiative heat flux flows directly to the portion of the die stack.

8. The semiconductor die stack bonding tool of claim 5, wherein the first shank is coupled to the upper wall such that the shroud is configured to move with the first shank.

9. A semiconductor die stack bonding tool, comprising:
a first bondhead coupled to a first shank and configured to contact a backside of a topmost die in a die stack formed on a substrate;
a second bondhead coupled to a second shank and configured to contact the substrate beneath the die stack;
a shroud positioned adjacent to the first bondhead, the shroud having a sidewall with a radiatively reflective inner surface facing the first bondhead; and
a radiative heat source positioned above the first bondhead and at a first portion of the radiatively reflective inner surface to selectively emit a radiative heat flux in a direction toward a second portion of the radiatively reflective inner surface,
wherein the first and second bondheads are configured to apply an opposing compressive pressure to the die stack, and
wherein the radiative heat source is configured to concurrently direct the radiative heat flux to the second portion of the radiatively reflective inner surface such that the radiative heat flux flows to the portion of the die stack by reflecting off of the second portion of the radiatively reflective inner surface.

10. The semiconductor die stack bonding tool of claim 9, wherein the first bondhead applies a first conductive heat flux to the topmost die in the die stack, and wherein the second bondhead applies a second conductive heat flux to the substrate toward the die stack.

11. The semiconductor die stack bonding tool of claim 9, wherein the shroud further comprises an upper wall having an opening through which the first shank passes during gangbonding of the die stack.

12. The semiconductor die stack bonding tool of claim 11, wherein the radiatively reflective inner surface is a first radiatively reflective inner surface, and wherein the upper wall has a second radiatively reflective inner surface positioned above and facing the first bondhead.

13. The semiconductor die stack bonding tool of claim 12, wherein the radiative heat flux flows to the portion of the die stack by reflecting off of the second radiatively reflective inner surface.

14. The semiconductor die stack bonding tool of claim 9, further comprising a second radiative heat source positioned lateral to the die stack and configured to selectively emit a second radiative heat flux in a direction away from the radiatively reflective inner surface to at least a portion of the die stack to reduce a vertical temperature gradient in the die stack.

15. The semiconductor die stack bonding tool of claim 11, wherein the first shank is coupled to the upper wall such that the shroud is configured to move with the first shank during the gangbonding.

16. A semiconductor die stack bonding tool, comprising:
a bondhead coupled to a shank and configured to contact a backside of a topmost die in a die stack formed on a substrate;
a shroud positioned adjacent to the bondhead, the shroud having a sidewall with a first radiatively reflective inner surface facing the bondhead and an upper wall having a second radiatively reflective inner surface positioned above and facing the bondhead; and
a radiative heat source positioned in lateral alignment with or above the bondhead and at a first portion of the first radiatively reflective inner surface to selectively emit a radiative heat flux in a direction away from the first portion of the first radiatively reflective inner surface toward the second radiatively reflective inner surface such that the radiative heat flux reflects off of the second radiatively reflective inner surface and a second portion of the first radiatively reflective inner surface toward at least a portion of the die stack to reduce a vertical temperature gradient in the die stack.

17. The semiconductor die stack bonding tool of claim 16, wherein the bondhead applies a conductive heat flux to the topmost die in the die stack.

18. The semiconductor die stack bonding tool of claim 16, wherein the bondhead comprises a first bondhead and the shank comprises a first shank, and wherein the semiconductor die stack bonding tool further comprises a second bondhead coupled to a second shank and configured to contact the substrate, the second bondhead aligned vertically with the first bondhead and positioned on a side of the substrate opposite the die stack.

19. The semiconductor die stack bonding tool of claim 18, wherein the first bondhead applies a first conductive heat flux to the topmost die in the die stack, and wherein the second bondhead applies a second conductive heat flux to the substrate toward a bottom of the die stack.

20. The semiconductor die stack bonding tool of claim 16, wherein the upper wall has an opening through which the shank passes.

\* \* \* \* \*